(12) United States Patent
Oh et al.

(10) Patent No.: US 6,200,903 B1
(45) Date of Patent: Mar. 13, 2001

(54) METHOD OF MANUFACTURING SEMICONDUCTOR DEVICES

(75) Inventors: Sang-kuen Oh; Sung-kyu Han; Yeon-sang Hwang; Dong-ha Lim, all of Suwon; Jung-ki Kim, Seoul, all of (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/399,189

(22) Filed: Sep. 20, 1999

(30) Foreign Application Priority Data

Dec. 29, 1998 (KR) .................................................. 98-59905

(51) Int. Cl.⁷ .................................................. H01L 21/302
(52) U.S. Cl. .......................... 438/705; 438/717; 438/725; 430/5; 216/62; 216/81
(58) Field of Search ............................... 430/5; 438/705, 438/717, 725; 216/62, 81

(56) References Cited

U.S. PATENT DOCUMENTS

| | | | |
|---|---|---|---|
| 4,068,018 | * | 1/1978 | Hashimoto et al. .................. 427/38 |
| 4,253,888 | * | 3/1981 | Kikuchi ................................. 156/643 |
| 4,321,317 | * | 3/1982 | MacIver .................................... 430/5 |
| 5,009,720 | * | 4/1991 | Hokuyo et al. .......................... 437/5 |
| 6,001,739 | * | 12/1999 | Konishi ................................. 438/692 |

FOREIGN PATENT DOCUMENTS

| 63-133629 | * | 6/1988 | (JP) . |
|---|---|---|---|
| 8-153714 | * | 6/1996 | (JP) . |
| 11-087321 | * | 3/1999 | (JP) . |

* cited by examiner

*Primary Examiner*—Gregory Mills
*Assistant Examiner*—George Goudreau
(74) *Attorney, Agent, or Firm*—Jones Volentine, L.L.C.

(57) ABSTRACT

A semiconductor device is manufactured by forming a thin layer over a semiconductor substrate, coating photoresist on the thin layer, forming a photoresist pattern over the semiconductor substrate, injecting ions into the photoresist pattern so as to harden the photoresist pattern, and etching the thin layer by using the hardened photoresist pattern as an etch mask. The hardened photoresist pattern has an increased etch selectivity with respect to an underlying layer, allowing the use of thinner photoresist layers and improved etching.

6 Claims, 5 Drawing Sheets

METHOD OF MANUFACTURING SEMICONDUCTOR DEVICES

BACKGROUND OF THE INVENTION

1. Field of the Invention

The present invention relates to a method of manufacturing semiconductor devices, and more particularly, to a method of manufacturing semiconductor devices to lower the thickness of the coated photoresist, improve the etch selectivity of the photoresist and the sublayer to be etched, and to effectively form fine patterns having a large aspect ratio.

2. Description of the Related Art

Generally, semiconductor devices are manufactured by carrying out processes including a deposition process, a photolithography process, an etch process, and an ion implantation process, etc.

That is, after forming multiple layers such as a polycrystalline layer, an oxide layer, a nitride layer, and a metal layer, etc. on a semiconductor substrate, patterns of integrated circuits for a semiconductor device are formed on the semiconductor substrate via a photolithography process, an etching process, an ion implantation process, etc.

In the photolithography process, a photoresist is coated on the semiconductor substrate having a certain sublayer formed thereon, the photoresist being a high-molecular photosensitive material, its solubility being changeable due to a chemical reaction by light. A photo mask having fine patterns formed thereon is aligned with the photoresist. Light is irradiated on the photoresist over the semiconductor substrate through the photo mask. So, a chemical reaction occurs on the photoresist, and therefore, the portion of the photoresist exposed to light may turn to more soluble material, or may turn to more nonsoluble material compared with the portion of the photoresist not exposed to light. Then, transformed photoresist is developed by a developer so that a positive or negative type photoresist pattern is formed on the sublayer. The photoresist pattern functions as a mask in the etch process for the sublayer and the ion implantation process after the photolithography process.

Recently, with increasing miniaturization of semiconductor devices and high-integration, the chip size is increased proportional to the increase of the memory capacity, but the size of the cell on which a pattern for a semiconductor device is formed, is decreased. However, to achieve the desired memory capacity with the decrease of the cell size, more pattern should be formed in the limited size of a cell. Therefore, the critical dimension of the pattern is decreased, and the height of the pattern is increased, thus increasing the aspect ratio of the pattern.

At present, because of the limit of the photolithography technique and the limit of the characteristics of photoresist, it is difficult to perform the process satisfying desired process conditions. Therefore, the photolithography process requires that the thickness of the photoresist coated on the semiconductor substrate be as thin as possible, and the etch process requires that the etch selectivity, between the photoresist pattern as an etch mask and the sublayer to be etched, should be as high as possible. That is, the photolithography process can be easily performed if the height of the photoresist is as thin as possible, and the etch process can be easily performed if the photoresist pattern is sufficiently maintained until the etch is completed for the sublayer.

FIGS. 1 to 3 are cross-sections illustrating some problems according to the conventional method of manufacturing semiconductor devices.

FIG. 1 shows that a photoresist pattern 6 is formed to a thickness of about 9500 Å on a polysilicon layer 4 having a thickness of about 1 μm over a semiconductor substrate 2, and then a bridge 8 is formed on the lower portion of the photoresist pattern 6 by carrying out the photolithography process, which means that the exposure is not sufficiently performed because the height of the photoresist is too great.

The thickness of the polysilicon layer 4 and the thickness of the photoresist are same in FIGS. 2 and 3.

FIG. 2 shows that the photoresist pattern 6 is fallen down because the aspect ratio of the photoresist pattern 6 formed on the semiconductor substrate 2 is large.

FIG. 3 shows that the etch selectivity of the polysilicon layer 4 to be etched, and the photoresist pattern 6, is not proper, and so, the height of the polysilicon pattern 10 becomes lower than desired because the portion of the polysilicon layer 4 is overetched more than desired, since the photoresist pattern 6 cannot endure until the etch for the polysilicon layer 4 is over. That is, the desired height of the polysilicon pattern 10 after the etch process is H1, but the real height of the polysilicon pattern 10 after the etch process is H2. Therefore, the polysilicon pattern 10 is overetched by the difference between H1 and the H2. The thickness of the photoresist coated for the formation of the polysilicon pattern 10 is determined such that the thickness of a photoresist pattern 6 formed on the polysilicon pattern 10 after the etch process is about 1000 Å to 2000 Å in consideration of the etch process. However, the above problems occur because the thickness of the photoresist and the polysilicon layer 4 are not uniform from wafer to wafer used as the semiconductor substrate 2, and from point to point in a wafer, which is more serious the larger the diameter of the wafer is.

Therefore, the bridge and the polysilicon pattern 10, its height being lower than desired, reduces the production yield because they degrade the characteristics of semiconductor devices. Also, the fallen photoresist pattern 6 functions as particles in the following etch process, or the ion-implantation process.

SUMMARY OF THE INVENTION

The present invention is directed to provide a method of manufacturing semiconductor devices by achieving a photoresist layer having a lower thickness and a high etch selectivity between the photoresist and the sublayer to be etched, thereby forming fine circuit patterns for a semiconductor device.

To achieve these and other advantages and in accordance with the purposes of the present invention, the method of manufacturing semiconductor devices comprises the steps of forming a certain thin layer over a semiconductor substrate, coating photoresist on the thin layer, forming a photoresist pattern over the semiconductor substrate, hardening the photoresist pattern, and etching the thin layer by using the hardened photoresist pattern as an etch mask.

The step of hardening the photoresist pattern is performed by injecting ions into the photoresist pattern.

It is to be understood that both the foregoing general description and the following detailed description are exemplary and explanatory and are intended to provide further explanation of the invention as claimed.

DETAILED DESCRIPTION OF PREFERRED EMBODIMENTS

Reference will now be made in detail to the preferred embodiments of the present invention, examples of which are illustrated in the accompanying drawings.

FIGS. 4 to 8 are cross-sectional views illustrating processes according to the present invention.

Figure 1:
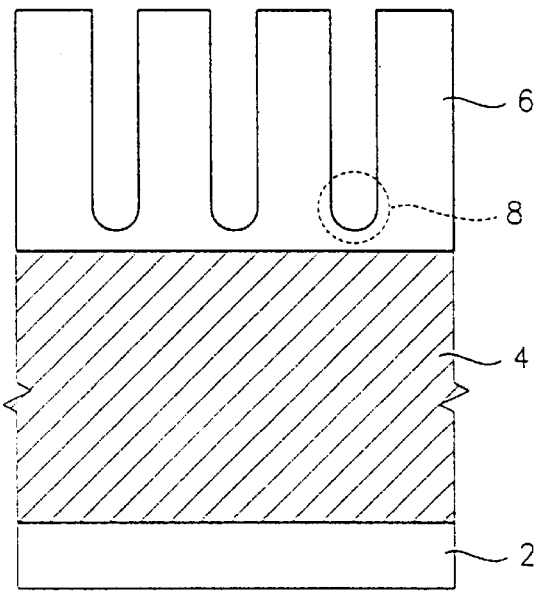
FIGS. 1 to 3 are cross-sectional views illustrating certain problems according to a conventional semiconductor device fabrication process.
Figure 2:
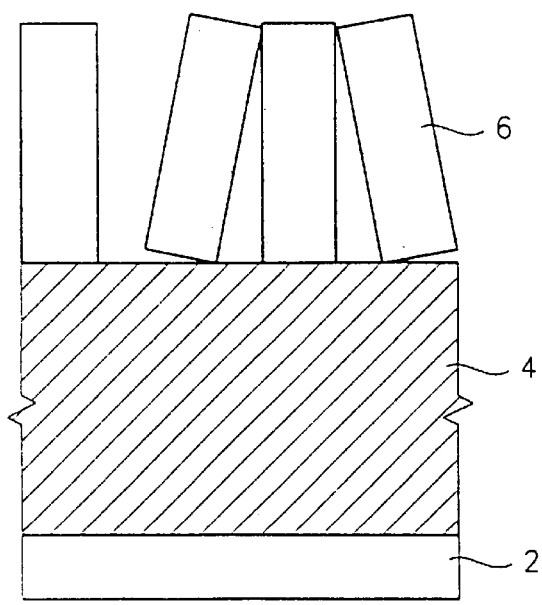
Figure 3:
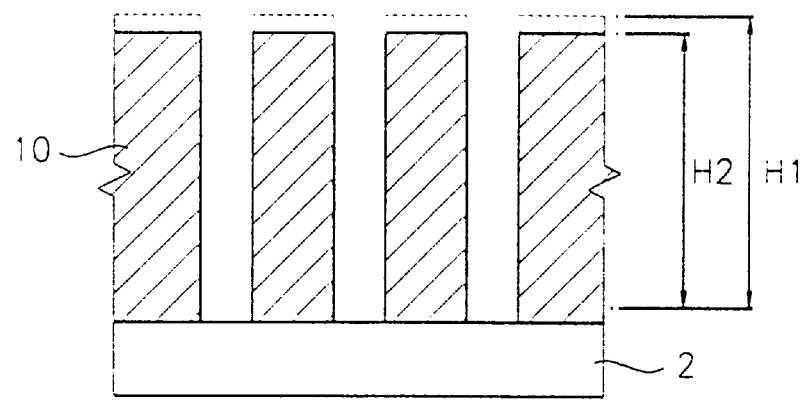
Figure 4:
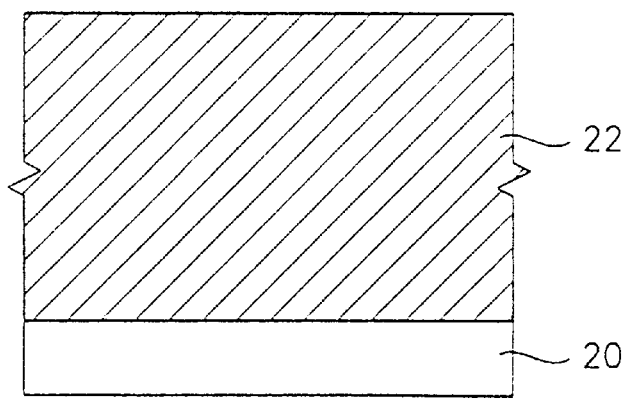
FIGS. 4 to 8 are cross-sectional views illustrating the processes according to the present invention.

Referring to FIG. 4, a polysilicon layer 22 is formed on a semiconductor substrate 20 to a thickness of about 1 $\mu$m. The polysilicon layer 22 is formed by a typical CVD (Chemical Vapor Deposition). In addition, impurities may be doped in the polysilicon layer 22 to form it as a conductive layer.

Figure 5:
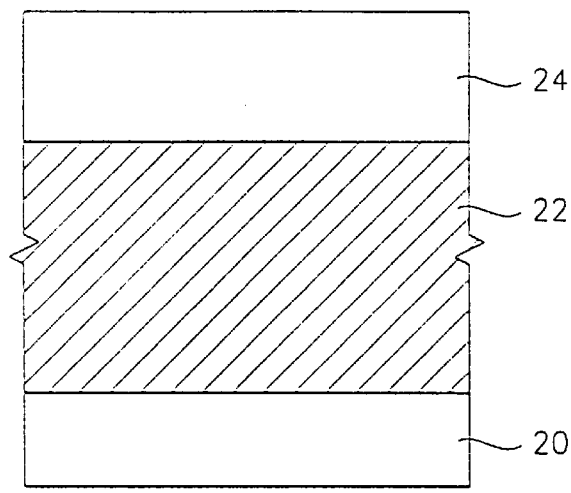

Referring to FIG. 5, a photoresist 24 is coated on the polysilicon layer 22 to a thickness of 6500 Å, and after aligning the photoresist 24 with a photo mask 26 having circuit patterns for a semiconductor device already-formed thereon, the photoresist 24 is exposed by irradiating light via the photo mask 26.

Figure 6:
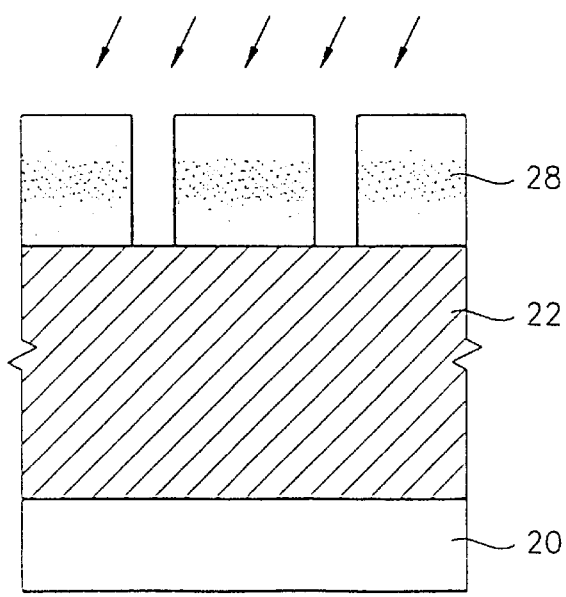

Referring to FIG. 6, by developing the exposed photoresist 24, and forming a first photoresist pattern 28, the semiconductor substrate 20 is moved to a typical ion-implantation system, wherein argon ions generated by ionization of argon (Ar) gas are injected into the first photoresist pattern 28 at a certain tilt angle so as to carbonate the first photoresist pattern 28 and harden it.

The tilt angle for the ion-injection on the first photoresist pattern 28 is selected so as to inject the argon ions only into the first photoresist pattern 28, and not the polysilicon layer 22. The tilt angle depends on the height of the first photoresist pattern 28, and the space critical dimensions of the first photoresist pattern 28 and therefore it is not confined to a certain specific angle, but will depend upon the particular dimensions and spacings of the photoresist pattern 28.

That is, the argon ions injected by the ion-implantation system harden the first photoresist pattern 28 by disconnecting the chains of H and O in the coupling structure of C—H—O as a main linkage of photoresist, so as to maintain only C and thereby harden the first photoresist pattern 28.

Gases which may be used in the ion-implantation process, include inert gas such as argon gas, P-type gas, or N-type gas. The P-type gas may be a $BF_3$ gas, and the N-type gas may be a $PH_3$ gas or $PF_3$ gas, preferably.

The dose of the ion-implantation is preferably between 1E15 to 5 E16 ions/cm$^2$. Preferably, the ion-implantation is carried out so as to achieve a maximum ion-implantation density at a depth equal to ½ of the height of the first photoresist pattern 28.

Of course, the injection direction of the argon ions for the first photoresist pattern 28 can be made vertical, but the surface of the polysilicon layer 22 of the space portion between the first photoresist pattern 28 can be damaged, thereby increasing the critical dimension of the space during the etch process, and producing undesirable results.

The hardened first photoresist pattern 28, resulting from the carbonization, improves the etch selectivity between the photoresist and the polysilicon layer 22, and improves etch resistivity during the process of etching the polysilicon layer 22.

Figure 7:
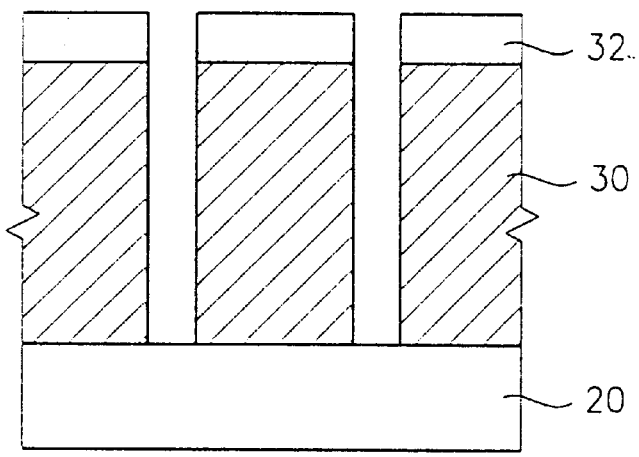

Referring to FIG. 7, by using the hardened first photoresist pattern 28 as an etch mask, the polysilicon layer 22 is etched and the polysilicon pattern 30 is formed.

At this time, the first photoresist pattern 28 over the polysilicon pattern 30 is etched by an etch process, and a second photoresist pattern 32, lower than the first photoresist pattern 28, is formed.

The thickness of the second photoresist pattern 32 is about 2000 Å, which results from the fact that the first photoresist pattern 28 is more hard than a conventional pattern because of the ion-implantation, and therefore, the etch selectivity is improved, and the etch resistivity is improved during the etch process. That is, even if the thickness of the first photoresist pattern 28 is less than in the conventional art, it can withstand the formation of the polysilicon pattern 30 from the polysilicon layer 22.

In the case that the photoresist 24 is coated to a thickness of about 9500 Å, the thickness of the second photoresist pattern 32 can remain at about 5000 Å.

Figure 8:
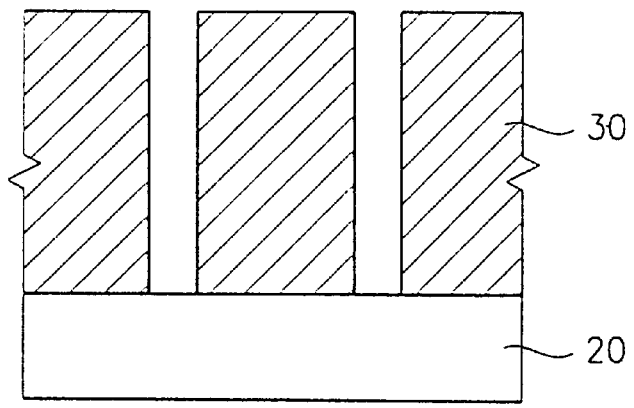

Referring to FIG. 8, by removing the second photoresist pattern 32 on the polysilicon pattern 30, the etch process for the formation of the polysilicon pattern 30 is completed.

As described above, by applying the ion-implantation process for the first photoresist pattern 28, and hardening the first photoresist pattern 28, the original thickness of the photoresist 24 when coating can be less than the conventional coating thickness thereby providing an easy photolithography process, and therefore, the bridge between the first photoresist pattern 28 and the breakage of the first photoresist pattern 28 can be prevented.

At this time, the coating thickness of the photoresist can be less by about 30 to 40% than for the conventional case, depending upon the sublayer to be etched. Therefore, the expenses for fabricating a semiconductor device can be saved.

Figure 9:
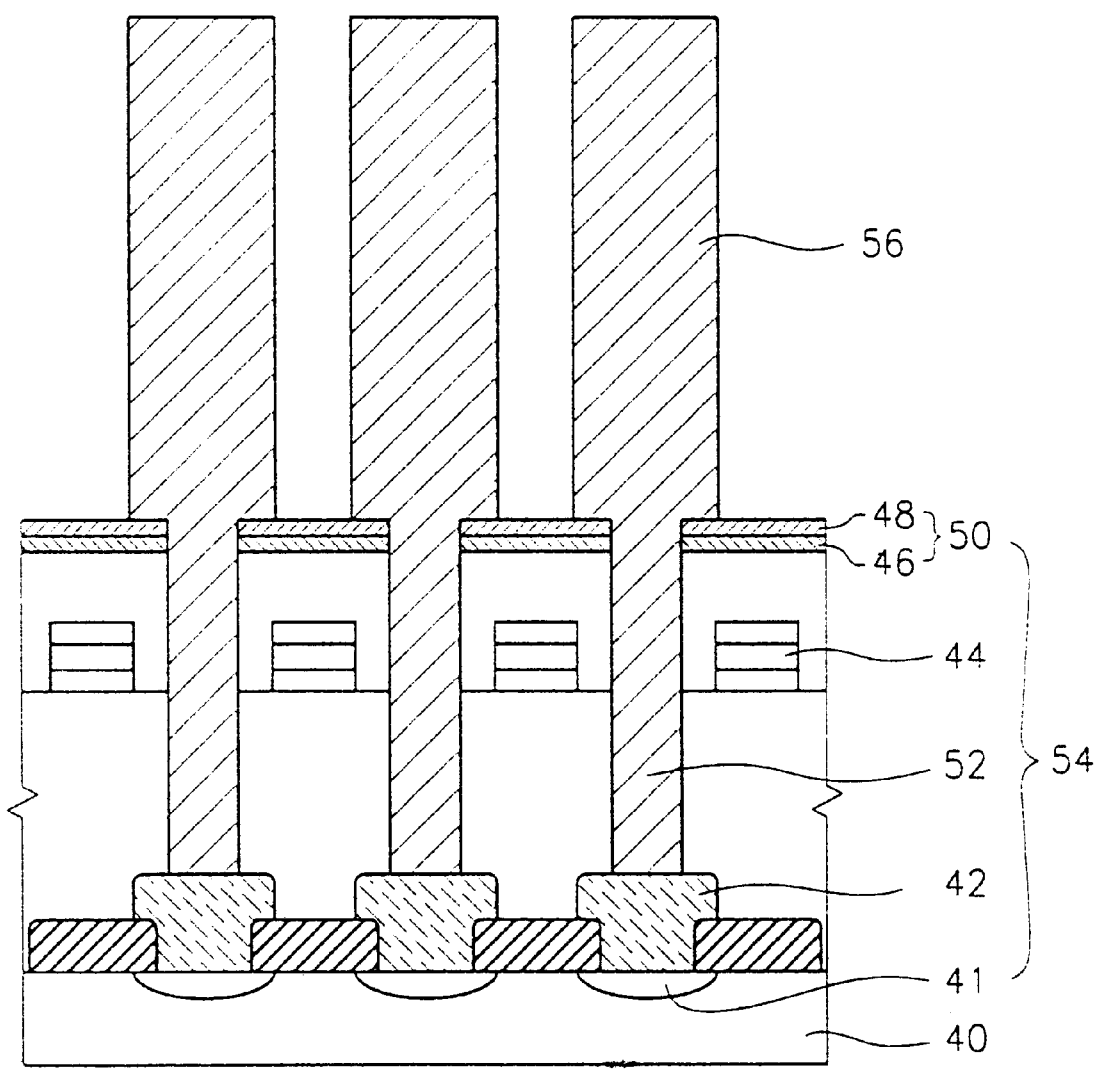
FIG. 9 is a cross-sectional view showing the storage electrode of the capacitor formed according to the semiconductor device fabrication process of the present invention.

FIG. 9 is a cross-sectional view showing the storage electrode of the capacitor formed according to the semiconductor device fabrication process of the present invention.

Referring to FIG. 9, on a semiconductor substrate 40 there is formed a substructure 54 including a cell pad 42, a bit line 44, which is connected to a drain region (not shown), an intermediate insulating layer 50 comprising an oxide layer 46 and a nitride layer 48, and a contact hole 52 formed over the cell pad 42, and a storage electrode 56 is formed on the substructure 54.

The storage electrode 56, which is in communication with the source region 41 of a transistor via the contact hole 52 so as to store the charges transmitted from the source region 41, is very important in determining the capacitance of the capacitor.

The capacitance is increased proportional to the surface area of the storage electrode 56. Normally, the capacitance can be increased by increasing the height of the storage electrode 56 or forming a hemispherical HSG layer on the surface of the storage electrode 56.

Therefore, if the method of manufacturing semiconductor devices of the present invention is employed in the formation of the storage electrode 56, the formation of the photoresist patterns having desirable critical dimensions can be made possible by reducing the thickness of the photoresist coated on the polysilicon layer, and by preventing the breakage of the photoresist pattern as in a conventional technique of using thick photoresist. Even though the thickness of the photoresist is thin according to the present invention, the etch selectivity between the polysilicon layer and the photoresist is improved, and the photoresist pattern stands until the polysilicon layer to be made thick to increase the capacitance is completely etched. Therefore, the thickness of the storage electrode 56 can be made thick thereby producing a capacitor having good device characteristics, even without the formation of the HSG layer.

Therefore, the thickness of the photoresist can be reduced, and the bridge formation and the falling down of the photoresist pattern are prevented. Also, the etch selectivity of the photoresist pattern and the sublayer to be etched is improved, and the etch uniformity is improved. Also, by reducing the usage of the photoresist, the expenses of fabricating a semiconductor device can be saved. Also, by applying the present invention to the formation of the capacitor, and by easily forming the storage electrode, the capacitance of the capacitor can be improved.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of manufacturing semiconductor devices comprising:

a) forming a thin layer on a semiconductor substrate:

b) coating photoresist on the thin layer;

c) forming a photoresist pattern in the photoresist on the semiconductor substrate;

d) hardening the photoresist pattern; and e) etching the thin layer by using the hardened photoresist pattern as an etch mask, said hardening of the photoresist pattern comprising injecting ions into the photoresist pattern at an angle greater than zero degrees with respect to vertical, so that the ions are implanted into the photoresist pattern and prevented from being implanted into the semiconductor substrate.

2. The method of manufacturing semiconductor devices of claim 1, wherein a gas used for injecting the ions is one selected from a group consisting of an inert gas, a P-type gas, and an N-type gas.

3. The method of manufacturing semiconductor devices of claim 2, where the gas is $BF_3$.

4. The method of manufacturing semiconductor devices of claim 2, where the gas is selected from a group consisting of $PH_3$ and $PF_3$.

5. The method of manufacturing semiconductor devices of claim 2, wherein a density of implanted ions is maximum at a depth equal to ½ of a height of the photoresist pattern.

6. The method of manufacturing semiconductor devices of claim 2, wherein an ion-implantation dose is between 1E15 to 5E16 ions/cm$^2$.

* * * * *